United States Patent
Marreiro et al.

(10) Patent No.: US 8,143,701 B2
(45) Date of Patent: Mar. 27, 2012

(54) METHOD OF FORMING A HIGH CAPACITANCE DIODE AND STRUCTURE THEREFOR

(75) Inventors: David D. Marreiro, Phoenix, AZ (US); Sudhama C. Shastri, Phoenix, AZ (US); Gordon M. Grivna, Mesa, AZ (US); Earl D. Fuchs, Phoenix, AZ (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 302 days.

(21) Appl. No.: 12/630,670

(22) Filed: Dec. 3, 2009

(65) Prior Publication Data

US 2010/0072573 A1 Mar. 25, 2010

Related U.S. Application Data

(62) Division of application No. 11/859,638, filed on Sep. 21, 2007, now Pat. No. 7,666,751.

(51) Int. Cl.
*H01L 21/20* (2006.01)

(52) U.S. Cl. ......... 257/603; 257/E29.335; 257/E21.356; 438/380; 438/963

(58) Field of Classification Search .................. 438/379, 438/380, 983; 257/603, E29.335, E21.356
See application file for complete search history.

(56) References Cited

U.S. PATENT DOCUMENTS

| | | | |
|---|---|---|---|
| 5,880,511 A | 3/1999 | Yu et al. | |
| 5,990,511 A | 11/1999 | Leas | |
| 6,115,592 A | 9/2000 | Ueda et al. | |
| 6,121,669 A | 9/2000 | Kalb et al. | |
| 6,140,674 A | 10/2000 | Hause et al. | |
| 6,489,660 B1 | 12/2002 | Einthoven et al. | |
| 6,822,295 B2 | 11/2004 | Larson | |
| 6,953,980 B2 | 10/2005 | Escoffier et al. | |
| 6,984,860 B2 | 1/2006 | Grivna et al. | |
| 2003/0205775 A1 | 11/2003 | Einthoven et al. | |
| 2006/0181385 A1 | 8/2006 | Hurley | |
| 2007/0073807 A1 | 3/2007 | Bobde | |

OTHER PUBLICATIONS

NUF9300 Data Sheet, Product Preview, "5-Line EMI Filter with ESD Protection", Copyright Semiconductor Components Industries, LLC, 2005, Apr. 2005—Rev. P1, Publication Order No. NUF9300/D, 6pps.

Data Sheet, SEMTECH, "uClamp3301D Low Voltage uClamp(tm) for ESD and CDE Protection, Protection Products—MicroClamp(tm)", Revision Oct. 25, 2004, Copyright 2004 Semtech Corp., 6pps.

Data Sheet, SEMTECH, RClamp0502B Ultra-Low Capacitance TVS for ESD and CDE Protection, Protection Products—RailClamp(r) Revision Apr. 5, 2005, Copyright 2005 Semtech Corp., 9pps.

Data Sheet, SEMTECH, "RClamp0514M RailClamp(r) Low Capacitance TVS Diode Array, Protection Products—RailClamp(r)", Revision Aug. 31, 2005, Copyright 2005 Semtech Corp., 11pps.

Data Sheet, SEMTECH, "RClamp05022P RClamp0524P Ultra Low Capacitance TVS Arrays, Protection Products—RailClamp(r)", Revision Sep. 19, 2006, Copyright 2006 Semtech Corp., 13pps.

*Primary Examiner* — Kiesha Bryant
*Assistant Examiner* — Mark Tornow
(74) *Attorney, Agent, or Firm* — Robert F. Hightower

(57) ABSTRACT

In one embodiment, high doped semiconductor channels are formed in a semiconductor region of an opposite conductivity type to increase the capacitance of the device.

10 Claims, 7 Drawing Sheets

US 8,143,701 B2

METHOD OF FORMING A HIGH CAPACITANCE DIODE AND STRUCTURE THEREFOR

The present application is a divisional application of prior U.S. application Ser. No. 11/859,638, filed on Sep. 21, 2007 now U.S. Pat. No. 7,666,751, which is hereby incorporated by reference, and priority thereto for common subject matter is hereby claimed.

BACKGROUND OF THE INVENTION

The present invention relates, in general, to electronics, and more particularly, to methods of forming semiconductor devices and structure.

In the past, the semiconductor industry utilized various methods and structures to integrate capacitors onto a semiconductor die with other active and passive elements. For example, it often was desirable to use capacitors to integrate a filter onto a semiconductor die. Parallel plate capacitors often were used for such applications. However, parallel plate capacitors occupied a large area of a semiconductor die. Other methods of forming capacitors utilized P-N junctions such as a junction of a diode or a transient voltage suppression (TVS) device. However, the structures of these devices often occupied a large die area or else did not provide a large enough capacitance value.

Accordingly, it is desirable to have a semiconductor device that provides a large capacitance and that utilizes a small die area.

For simplicity and clarity of the illustration, elements in the figures are not necessarily to scale, and the same reference numbers in different figures denote the same elements. Additionally, descriptions and details of well-known steps and elements are omitted for simplicity of the description. As used herein current carrying electrode means an element of a device that carries current through the device such as a source or a drain of a MOS transistor or an emitter or a collector of a bipolar transistor or a cathode or anode of a diode, and a control electrode means an element of the device that controls current through the device such as a gate of a MOS transistor or a base of a bipolar transistor. Although the devices are explained herein as certain N-channel or P-Channel devices, a person of ordinary skill in the art will appreciate that complementary devices are also possible in accordance with the present invention. It will be appreciated by those skilled in the art that the words during, while, and when as used herein are not exact terms that mean an action takes place instantly upon an initiating action but that there may be some small but reasonable delay, such as a propagation delay, between the reaction that is initiated by the initial action. For clarity of the drawings, doped regions of device structures are illustrated as having generally straight line edges and precise angular corners. However, those skilled in the art understand that due to the diffusion and activation of dopants, the edges of doped regions generally may not be straight lines and the corners may not be precise angles.

DETAILED DESCRIPTION OF THE DRAWINGS

Figure 1:
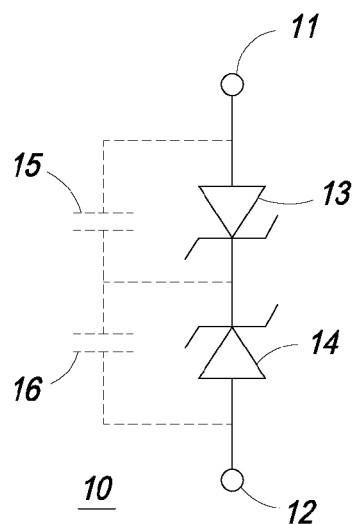
FIG. 1 schematically illustrates an embodiment of a portion of a circuit representation of a semiconductor device that provides a large capacitance in accordance with the present invention.

FIG. 1 schematically illustrates a circuit representation of an embodiment of a portion of a semiconductor device 10 that provides a large capacitance and utilizes a small area of a semiconductor die. Device 10 includes two terminals, a first terminal 11 and a second terminal 12. Either of terminals 11 or 12 may be an input or an output terminal. Device 10 includes a first zener diode 13 that is coupled in series with a second zener diode 14. The cathode of diodes 13 and 14 are connected together at a common node while the anode of diode 13 is connected to terminal 11 and the anode of diode 14 is connected to terminal 12. Diode 13 is used to form a capacitor 15 and diode 14 is used to form a capacitor 16. Capacitors 15 and 16 are illustrated by dashed lines. If a positive voltage is applied to terminal 11 relative to terminal 12, diode 13 is forward biased and diode 14 is reversed biased so that current does not flow through device 10. However, the forward biased state of diode 13 forms a large capacitance value for capacitor 15. Similarly, if a positive voltage is applied to terminal 12 relative to terminal 11, diode 14 is forward biased and diode 13 is reversed biased so that current does not flow through device 10. However, the reversed biased state of diode 14 forms a large capacitance value for capacitor 16.

Figure 2:
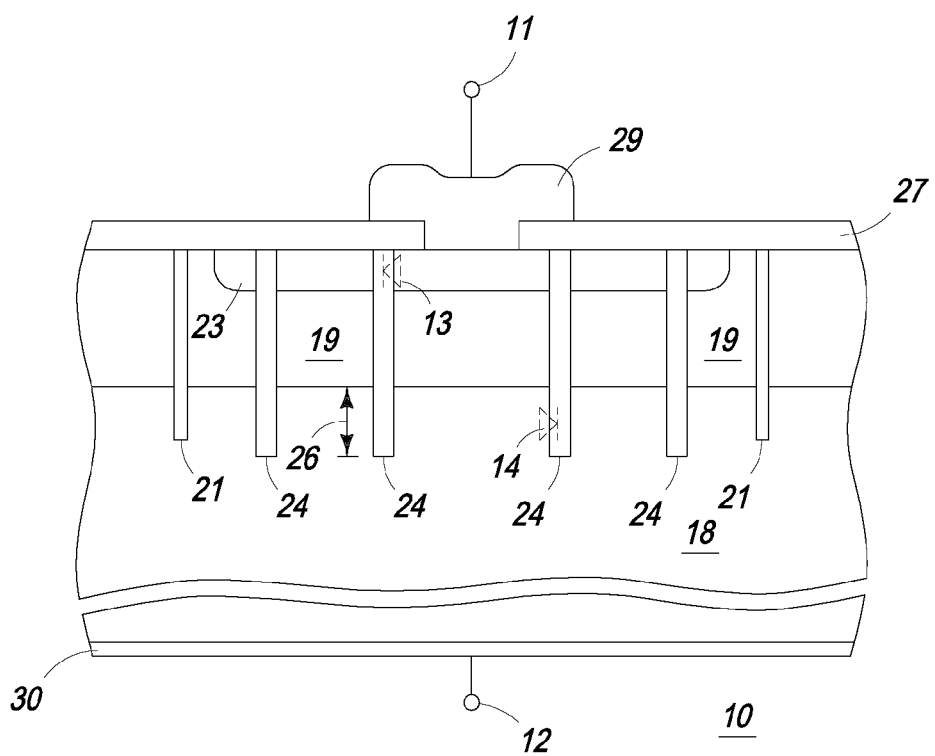
FIG. 2 illustrates a cross-section of a portion of an embodiment of the semiconductor device FIG. 1 in accordance with the present invention.

FIG. 2 illustrates a cross-sectional view of a portion of an embodiment of a semiconductor die on which device 10 is formed. Diodes 13 and 14 are illustrated in a general manner by dashed lines appearing near to the elements of device 10 that assist in forming diodes 13 and 14. Device 10 is formed on a bulk semiconductor substrate 18. Substrate 18 generally is formed with a high doping concentration that assists in forming the high capacitance value for capacitor 16. A semiconductor layer 19 is formed adjacent to the dopants that form the high doping concentration of substrate 18. Layer 19 typically is formed on a top surface of substrate 18 and has a doping concentration that is lower than the doping concentration of substrate 18. The doping concentration of layer 19 usually is at least one or two orders of magnitude lower than the doping concentration of substrate 18. In the preferred embodiment, substrate 18 has a P-type doping concentration that is no less then the approximately $1 \times 10^{19}$ atoms/cm$^3$. Also in this preferred embodiment of layer 19 has an N-type doping concentration that is no greater than about $1 \times 10^{17}$ atoms/cm$^3$ and preferably is between approximately $1 \times 10^{13}$ and $1 \times 10^{17}$ atoms/cm$^3$. Layer 19 may be formed by a variety of well-known methods including forming an epitaxial layer on the surface of substrate 18. A doped region 23 is formed on a top surface of semiconductor layer 19. The top surface of layer 19 is opposite to the top surface of substrate 18. Doped region 23 generally is formed to have a conductivity and a doping concentration that is approximately the same as substrate 18. A semiconductor channel 24 may subsequently be formed to assist in forming diodes 13 and 14. Preferably, a plurality of semiconductor channels 24 are formed so that each of channels 24 contacts region 23 and extends from doped region 23, through layer 19, and extends a distance 26 into substrate 18. Semiconductor channels 24 typically are formed to extend to the top surface of layer 19 and region 23. Channels 24 generally are formed after doped region 23 is formed. Channels 24 typically are formed by creating an opening that extends from the surface of region 23 and layer 19 into substrate 18. For example, the openings may be formed by utilizing techniques that are commonly used to form trench openings in a semiconductor material. Thereafter, a semiconductor material, such as in-situ doped polysilicon, could be formed within the openings. It is desirable for the sidewalls of the openings to have a smooth surface in order to assist in minimizing leakage. Channels 24 preferably are formed so that a large surface area of each channel 24 is adjacent to the material of region 23 and also adjacent to the material of substrate 18. This large surface area assists in forming the large capacitance for capacitors 15 and 16. Also, each of channels 24 are spaced close together in order to maximize the number of channels that may be formed within region 23. In the preferred embodiment, channels 24 are approximately 0.4 to 2.0 microns wide and also spaced about 0.6 to 2.0 microns and preferably one (1) micron apart. Distance 26 generally is about three (3) microns to assist in increasing the capacitance. These spacings and widths assist in maximizing the surface area and the resulting capacitance. As a result, device 10 provides a capacitance per unit area that is at least about 2.5 femto-farads per square micron. Those skilled in the art will appreciate that region 23 preferably should be continuous and that channels 24 should neither separate nor isolate any portion of region 23 away from the remainder of region 23 (refer to FIG. 4). If a portion of region 23 were separated, it would form a separate diode. Those skilled in the art will appreciate that because of the opposite doping types of region 23 and channels 24, channels 24 should not be positioned to contact conductor 29. A parasitic P-N diode is formed at the P-N junction of substrate 18 and layer 19. This parasitic P-N diode does not effect the operation of diodes 13 and 14 nor the capacitance of device 10.

An isolation trench 21 is used to isolate device 10 from other active and passive elements that may be formed on substrate 18. Trench 21 is formed to extend from the surface of layer 19, through layer 19 and into substrate 18. Isolation trench 21 is formed as a closed polygon, such as a square or rectangular cylinder, having sidewalls that surround a portion of layer 19 in which region 23 and channels 24 are positioned. As will be seen further hereinafter relating to FIG. 4, trench 21 forms a closed polygon on the surface of layer 19. Subsequently, a dielectric 27 usually is formed on the top surface of layer 19. Dielectric 27 usually is formed on all of layer 19 but is at least on the portion of layer 19 that is enclosed by trench 21. An opening is formed in dielectric 27 overlying and exposing a portion of the surface of region 23. A conductor 29 is formed in the opening and electrically contacting region 23 in order to connect region 23 to terminal 11. Additionally, a conductor 30 usually is formed on the bottom surface of substrate 18 in order to connect substrate 18 to terminal 12.

The large doping concentration of channels 24 and doped region 23 forms zener diode 13 at the interface of each of channels 24 and region 23. Additionally, the large doping concentration of channels 24 and substrate 18 form zener diode 14 at the interface of each of channels 24 and substrate 18. Because of the large doping concentration, a narrow depletion region is formed around the portion of channels 24 that are within substrate 18 and around the portion of channels 24 that are within region 23. These narrow depletion regions substantially deplete the areas of carriers thereby forming the large capacitances when either of diodes 13 are 14 are reversed biased. This assists in providing device 10 the high capacitance per unit area.

Figure 3:
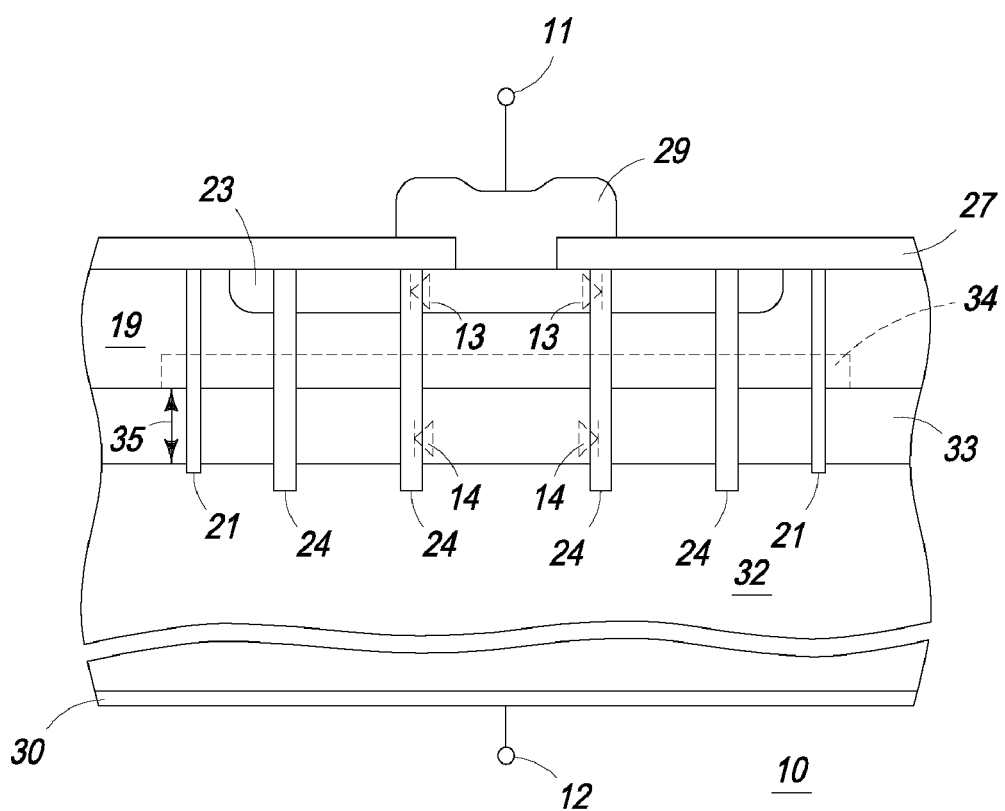
FIG. 3 illustrates a cross-section of a portion of another embodiment of the semiconductor device of FIG. 1 in accordance with the present invention.

FIG. 3 illustrates a cross-sectional view of a portion of an alternate embodiment of device 10. The alternate embodiment of device 10 includes a semiconductor substrate 32 that is similar to substrate 18. However, substrate 32 is formed with a lower doping concentration than substrate 18. In order to provide the large doping concentration and carrier concentration, a first region or semiconductor region 33 is formed overlying the lower doping concentration of substrate 32. Semiconductor region 33 may be formed by a variety of methods including forming an epitaxial layer on the surface of substrate 32. Alternately, a portion of the top surface of substrate 32 may be doped, such as by ion implantation or diffusion, to form region 33. Region 33 has substantially the same doping type and concentration as substrate 18 (FIG. 2). A thickness 35 of region 33 is formed to maximize the surface area between channels 24 and region 33 in order to maximize the capacitance of device 10. Thickness 35 generally is at least the same as distance 26 illustrated in FIG. 2. A second semiconductor region 34 may be formed abutting the dopants of region 33. Region 34 has the same doping type as layer 19 but a doping concentration that is substantially the same as region 33. Region 34 may be formed by a variety of methods including forming an epitaxial layer having the doping type and concentration of region 34 or alternately by forming an epitaxial layer and doping a portion of such epitaxial layer to form region 34. The high doping concentration of channels 24 and region 33 forms diode 14 along the P-N junction of channels 24 and region 33. Region 34 assist in reducing the leakage of device 10 by interrupting possible carrier paths between substrate 33 and region 23 along trench 21. Region 34 should intersect all of channels 24 and preferably extends past trench 21. Either of regions 33 or 34 regions 33 and 34 may be omitted without affecting the high capacitance of device 10.

Figure 4:
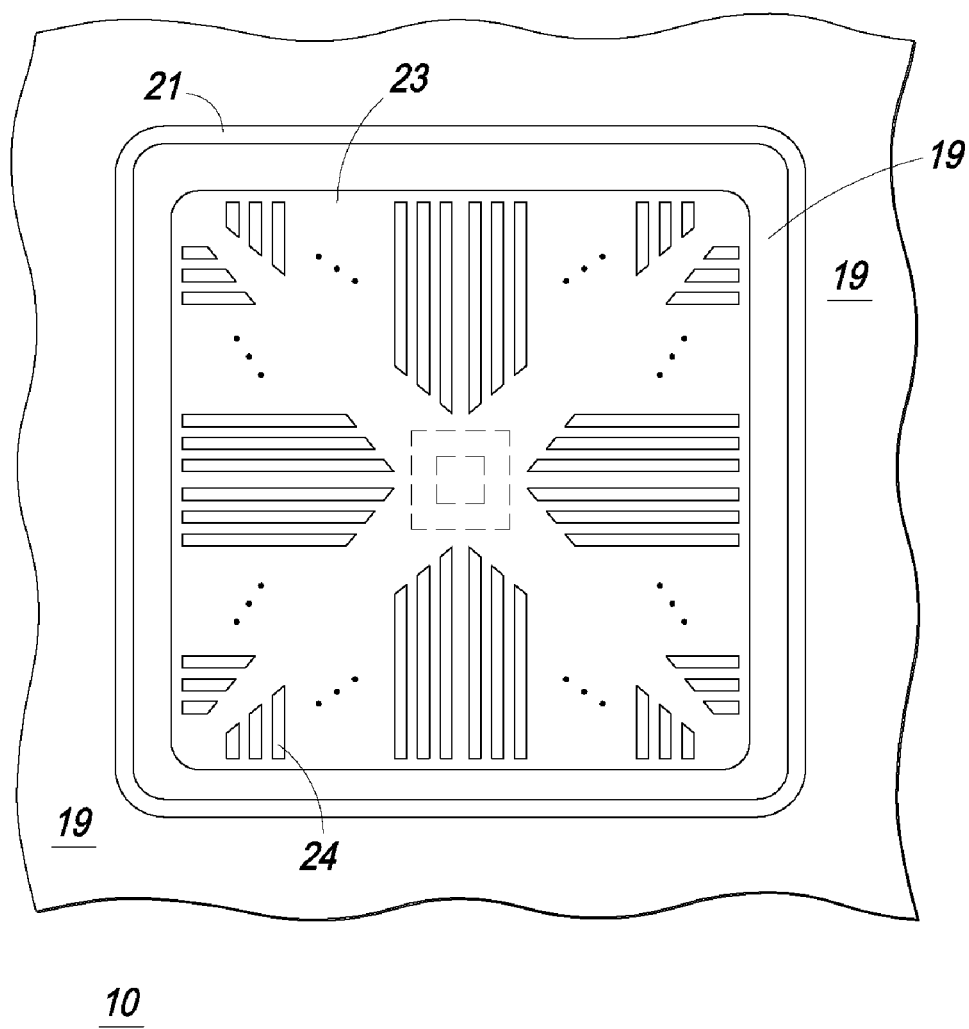
FIG. 4 illustrates a plan view of the semiconductor device of FIG. 2 and FIG. 3 in accordance with the present invention.

FIG. 4 illustrates a plan view of device 10 that was explained in the description of FIG. 1-FIG. 3. FIG. 4 illustrates device 10 prior to forming conductor 29 so that the topology of device 10 may be seen. Conductor 29 is illustrated by dashed lines. FIG. 4 illustrates the multiply-connected closed polygon characteristic of trench 21. As indicated hereinbefore, region 23 preferably should be formed as one continuous region and channels 24 should not separate nor isolate any portion of region 23 away from the remainder of region 23. The exemplary embodiment illustrated in FIG. 4 shows one potential layout topology for channels 24 that does not isolate any portion of region 23. Those skilled in the art will appreciate that other potential layout topologies may provide the desired condition of region 23.

Figure 5:
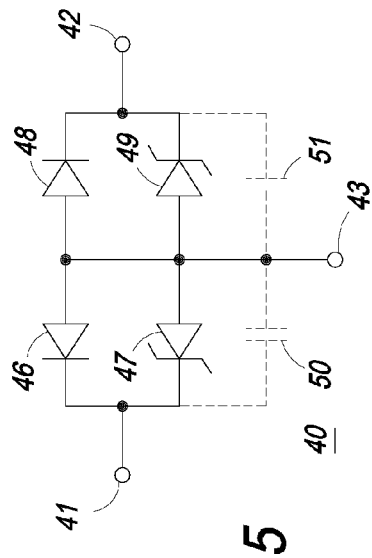
FIG. 5 schematically illustrates an embodiment of a portion of a circuit representation of another semiconductor device that provides a large capacitance in accordance with the present invention.

FIG. 5 schematically illustrates an embodiment of a portion of a semiconductor device 40 that is an alternate embodiment of device 10 that was explained in the description of FIG. 1-FIG. 4. Device 40 includes a first terminal 41 and a second terminal 42 in addition to a third terminal 43. Terminals 41 and 42 typically are used for either input or output terminals and terminal 43 generally is left floating or may be connected to a lower potential than terminals 41 and 42, such as a ground reference potential. Device 40 facilitates providing bi-directional protection between terminals 41 to 42 with terminal 43 floating, and unidirectional protection between either or both of terminals 41 and 42 to terminal 43 with a common reference, such as ground, connected to terminal 43. Device 40 includes zener diodes 47 and 49 that have anodes commonly connected to each other and to terminal 43. A cathode of diode 49 is connected to terminal 42 and a cathode of diode 47 is connected to terminal 41. Additionally, device 40 includes parasitic P-N junction diodes 46 and 48 that are connected in parallel with respective diodes 47 and 49. A positive voltage applied to terminal 41 relative to terminal 42 forward biases diode 49 and reverse biases diode 47. Forward biasing diode 49 forms a capacitor 51 that has a high capacitance value. Similarly, applying a voltage to terminal 42 that is positive relative to terminal 41 forward biases diode 47 and reverse biases diode 49. A capacitor 50 having a high capacitance value is formed by the forward biasing of diode 47.

Figure 6:
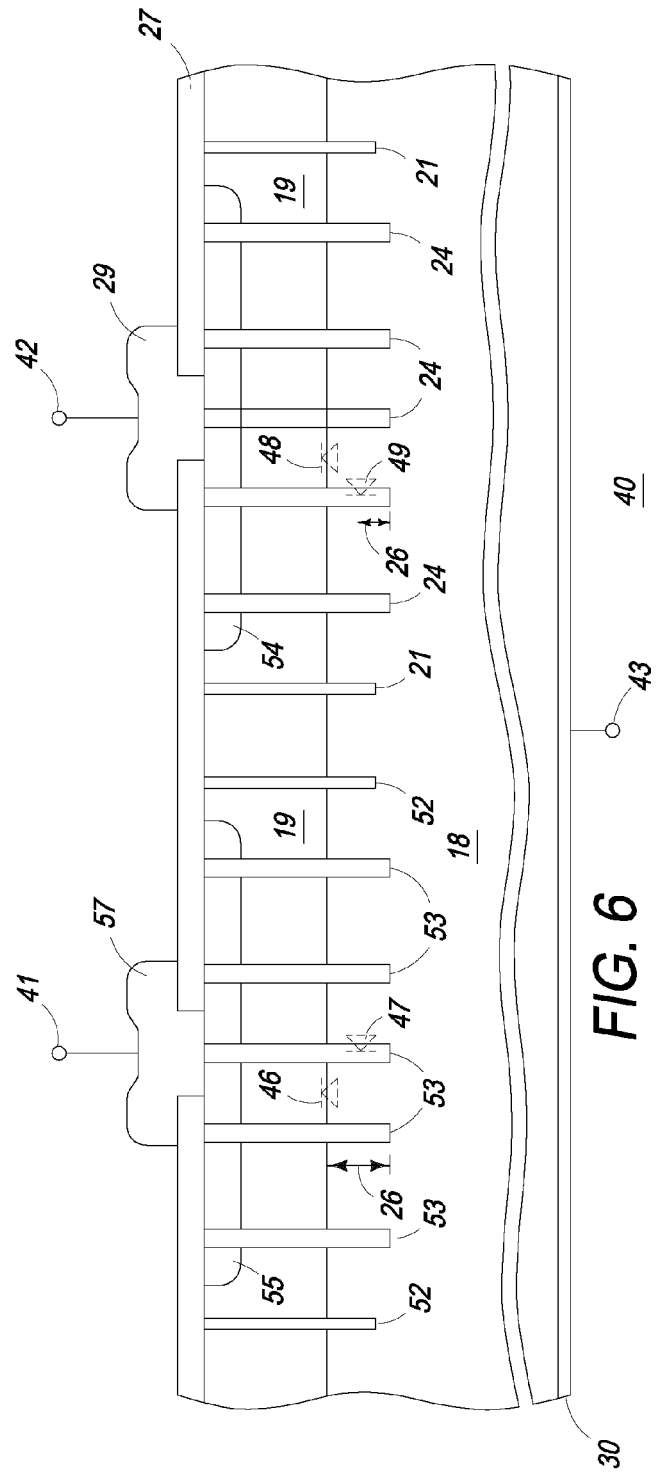
FIG. 6 illustrates a cross-section of a portion of an embodiment of the semiconductor device of FIG. 5 in accordance with the present invention.

FIG. 6 illustrates a cross-sectional view of a portion of an embodiment of a semiconductor die on which device 40 is formed. Device 40 is formed on substrate 18 along with layer 19 in a manner similar to device 10 that was described in the description of FIG. 1-FIG. 3. However, device 40 utilizes a plurality of isolation trenches including isolation trench 21 in addition to an isolation trench 52 that is formed substantially identically to trench 21. Isolation trench 21 surrounds a first portion of layer 19 in which diodes 48 and 49 are formed while isolation trench 52 surrounds a second portion of layer 19 wherein diodes 46 and 47 are formed. Trench 21 isolates the first portion of layer 19 from the second portion of layer 19 to prevent current flow through layer 19 between the first and second portions thereof. Additionally, region 23 of device 10 is replaced with doped region 54 for diodes 48 and 49, and is also replaced by a doped region 55 for diodes 46 and 47. Regions 54 and 55 have a doping type that is the same as the dopants of channels 24. For example, doped regions 54 and 55 are formed to have an N-type conductivity with a doping concentration that is substantially the same as the doping concentration of substrate 18 and channels 24.

Semiconductor channels 53 are formed in the second portion of layer 19 to extend from the surface of the second portion of layer 19 through region 55, through the second portion of layer 19, and into substrate 18. Semiconductor channels 53 are formed similarly to channels 24. Dielectric 27 usually is applied to cover the surface of layer 19. An opening is formed in dielectric 27 overlying region 54 and another opening is formed in dielectric 27 overlying region 55. Conductor 29 is formed through the opening overlying region 54 and electrically contacting region 54. Conductor 29 provides an electrical connection to terminal 42. A conductor 57 is formed through the opening overlying region 55 and electrically contacting region 55. Conductor 57 provides a connection to terminal 41.

Diode 47 is formed by the P-N junctions at the interface between each of channels 53 and substrate 18. The high doping concentration of channels 53 and substrate 18 forms a high capacitance value for capacitor 50. Parasitic P-N diode 46 is formed along the P-N junction at the interface of the high doping concentration of substrate 18 with the lower doping concentration of the portion of layer 19 that is enclosed by trench 52. The anode of diode 46 is formed commonly with the anode of diode 47. Similarly, diode 49 is formed along the P-N junctions formed by the high doping concentration of channels 24 and the high doping concentration of substrate 18. Parasitic P-N diode 48 is formed by the P-N junction at the interface of the lower doping concentration of the region of layer 19 that is enclosed by trench 21 and the higher doping concentration of substrate 18. The anode of diode 48 is formed in substrate 18 commonly with the anode of diode 49 in addition to the anode of diodes 46 and 47. Consequently, conductor 30 is electrically connected commonly to the anode of diodes 46, 47, 48, and 49.

Forming diodes 47 and 49 side-by-side on the same substrate facilitates forming the bi-directional capability of device 40. Additionally the side-by-side construction facilitates forming substantially symmetrical junctions for diodes 47 and 49 since channels 24 and 53 may be formed simultaneously and regions 54 and 55 may be formed simultaneously. The connection to the common anodes of diodes 47 and 49 assists in forming device 40 with unidirectional protection. The capability to leave terminal 43 floating assists in using device 40 in chip-on-lead and flip-chip applications.

Devices 10 and 40 may be used in a variety of applications that can utilize a high capacitance. For example, device 10 or 40 may be used as a portion of an electrostatic discharge (ESD) protection device. Additionally, either of devices 10 or 40 may be used as a capacitive element in a filter or other electrical device that can use the capacitance provided by devices 10 or 40.

Figure 7:
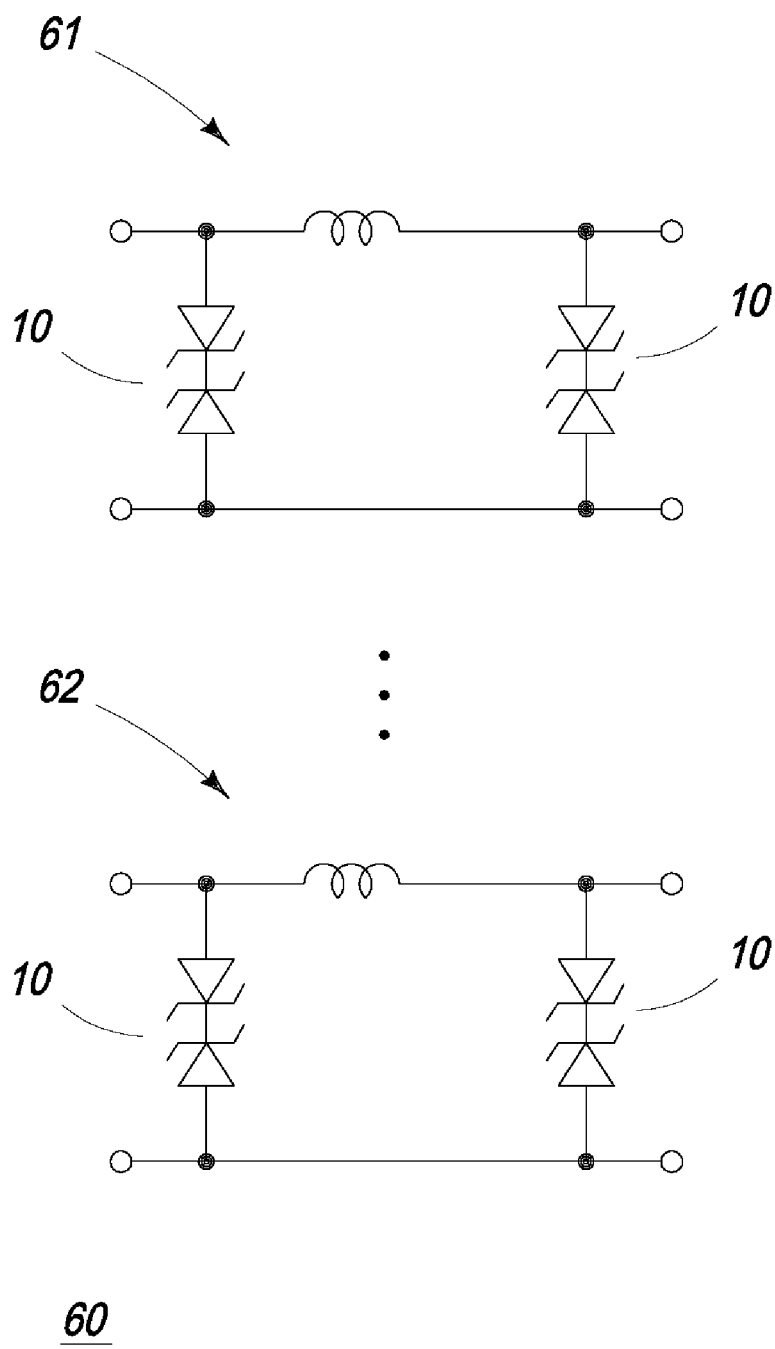
FIG. 7 schematically illustrates an embodiment of a portion of an application circuit that uses the semiconductor device of FIG. 1 in accordance with the present invention.

FIG. 7 illustrates a circuit representation of a multi-channel filter 60 that includes a plurality of filter channels such as a first filter channel 61 and a second filter channel 62. Each of channels 61 and 62 uses a device 10 for two different elements of each channel. Each of channels 61 and 62 also includes an inductor that may be formed on the surface overlying device 10 or 40, such as on the surface of dielectric 27. Such inductor elements that are formed on a semiconductor device are well known to those skilled in the art. All of devices 10 may be formed on substrate 18 and isolated from each other by an isolation trench such as trench 21.

Figure 8:
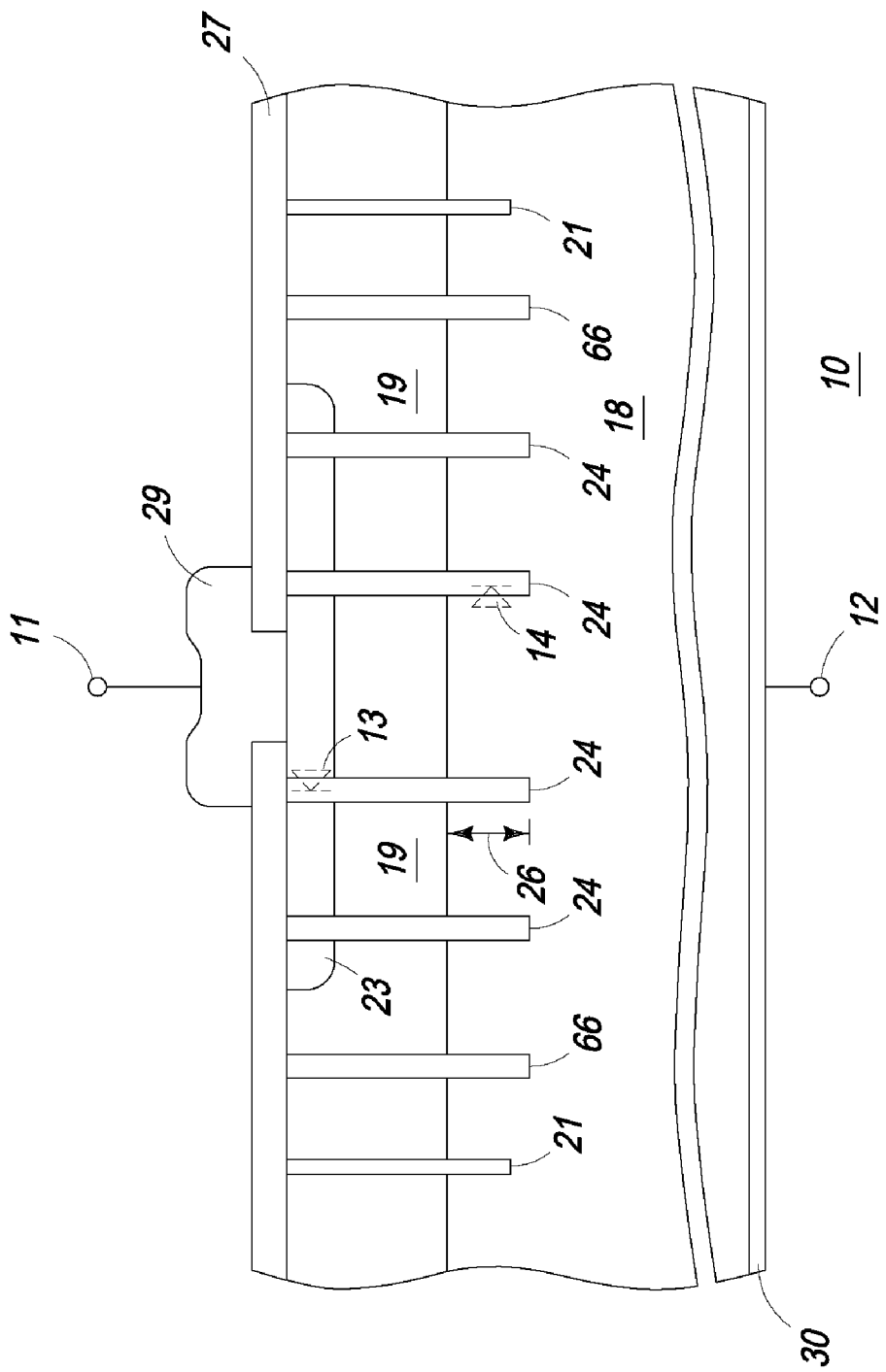
FIG. 8 illustrates a cross-section of a portion of another embodiment of the semiconductor device of FIG. 2 in accordance with the present invention.

FIG. 8 illustrates a cross-sectional view of a portion of another embodiment of semiconductor device 10 of FIG. 1. The alternate embodiment of device 10 that is illustrated in FIG. 8 includes a semiconductor channel 66 that is similar to channels 24. However, channel 66 is formed as a closed polygon having sidewalls that surround a portion of layer 19 in which region 23 and channels 24 are positioned. Channel 66 is positioned external to region 23 between trench 21 and region 23, and is formed to extend from the surface of layer 19 into substrate 18. Channel 66 generally is formed by creating an opening that extends from the surface of region 23 and layer 19 into substrate 18. For example, the opening may be formed by utilizing techniques that are commonly used to form trench openings in a semiconductor material. Thereafter, a semiconductor material, such as in-situ doped polysilicon, could be formed within the openings. Channel 66 generally has a conductivity type that is opposite to substrate 18 and has a doping concentration that is approximately the same as substrate 18. Channel 66 minimizes leakage currents that may flow between region 23 and substrate 18.

Figure 9:
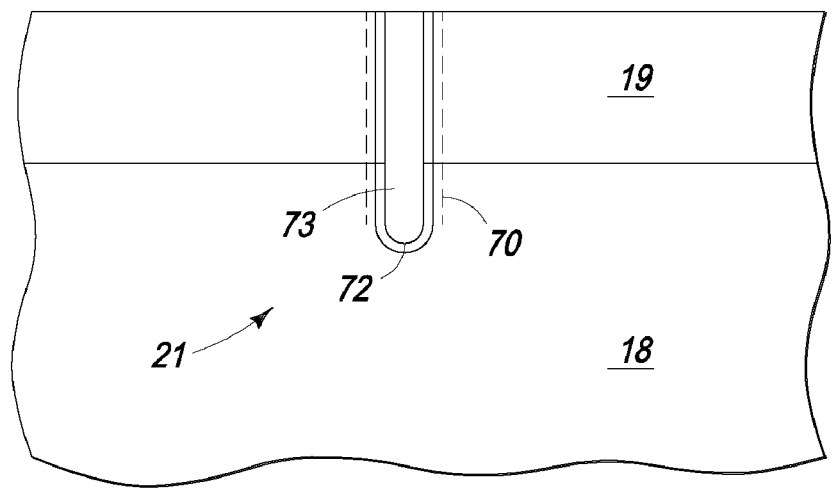
FIG. 9 illustrates a cross-section of a portion of yet another embodiment of the semiconductor device of FIG. 2 in accordance with the present invention.

FIG. 9 illustrates a cross-sectional view of a portion of device 10 illustrating a method of forming trench 21. In the embodiment of trench 21 illustrated in FIG. 9, an opening is formed through layer 19 and into substrate 18. Thereafter, a doped region having the conductivity type of layer 19 is formed along the sidewalls of the opening but not on the bottom of the opening as illustrated by dashed lines 70. The doped region is formed in the portion of layer 19 that is near the sidewalls of the opening. The extension of the doped region into region 18 forms a parasitic diode that does not impact the electrical performance of device 10. The resulting doping concentration within layer 19 near the sidewalls of trench 21 is usually no less than about $1\times10^{17}$ atoms/cm$^3$. Subsequently a dielectric 72, such as silicon dioxide, is formed along the sidewalls and the bottom of the opening. The dielectric may completely fill the opening or a portion of the opening may remain open. Any remaining portion of the opening generally is filled with a semiconductor material, such as undoped polysilicon.

Figure 10:
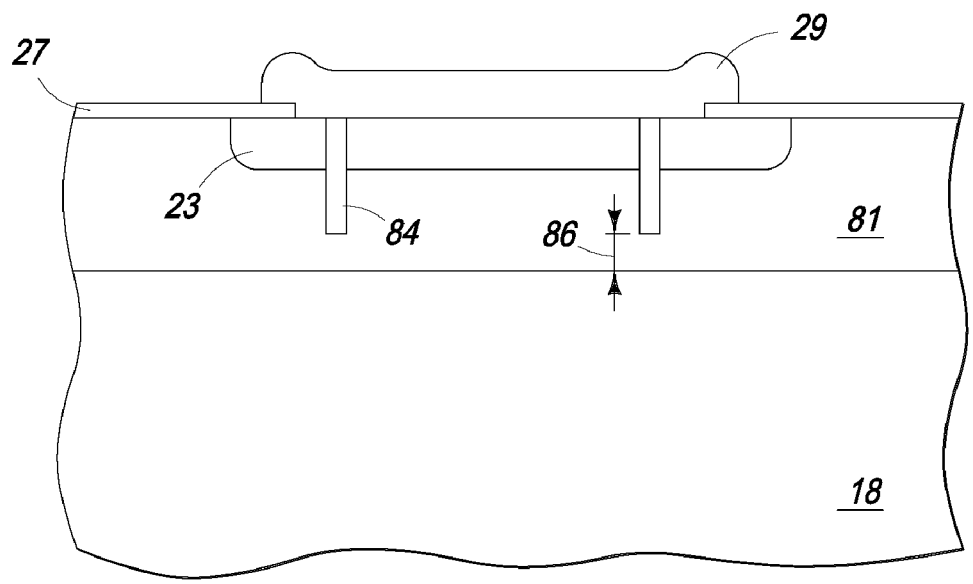
FIG. 10 illustrates a cross-section of a portion of an embodiment of another semiconductor device in accordance with the present invention.

FIG. 10 illustrates a cross-sectional view of a portion of an embodiment of a zener diode 80 that has a high capacitance. Diode 80 includes a semiconductor layer 81, such as an epitaxial layer, that is formed on substrate 18. Layer 81 has a conductivity type that is the same as substrate 18 and a doping concentration that is at least one order of magnitude less than that of substrate 18. The doping concentration of layer 81 generally is between approximately $1\times10^{13}$ and $1\times10^{17}$ atoms/cm$^3$. A plurality of semiconductor channels 84 are formed within region 23 and extending into layer 81. Channels 84 are similar to channels 24 except that channels 84 do not extend into substrate 18. Channels 84 extend a depth that leaves a distance 86 between the bottom of channels 84 and substrate 18. Distance 86 is sufficient to ensure that device 80 does not operate in the punch-through operating region. The large surface area of channels 84 that is adjacent to layer 81 assists in forming a high capacitance for diode 80. The process of forming device 80 is simple and may reduce manufacturing costs. Conductor 29 may be formed to electrically contact region 23 or may be formed to electrically contact channels 84 directly with region 23 omitted.

Alternately, substrate 18 may be replaced with a lower doped substrate that has the doping concentration of layer 81. In such an embodiment, layer 81 may be omitted. Those skilled in the art will appreciate that another doped region similar to region 23 may be formed on layer 81 and spaced a distance from region 23. Another plurality of channels may be formed through the new region and into layer 81. The second plurality of channels would form another diode that would have an anode connected to the anode of the diode of channels 84. The anodes would be commonly connected to substrate 18.

In view of all of the above, it is evident that a novel device and method is disclosed. Included, among other features, is forming a zener diode using a plurality highly doped channels that extend between two highly doped regions of the opposite conductivity. Using vertical channels improves the density and reduces the surface area required to form the diodes. The surface area of the channels also increases the area of the zener diodes and improves the current conductivity of each diode.

While the subject matter of the invention is described with specific preferred embodiments, it is evident that many alternatives and variations will be apparent to those skilled in the semiconductor arts. Those skilled in the art appreciate that the conductivity types may be reversed. Additionally, the word "connected" is used throughout for clarity of the description, however, it is intended to have the same meaning as the word "coupled". Accordingly, "connected" should be interpreted as including either a direct connection or an indirect connection.

The invention claimed is:

1. A high capacitance diode comprising:
 a semiconductor substrate of a first conductivity type having first and second surfaces;
 a first region of the first conductivity type adjacent the first surface of the semiconductor substrate, the first region having a first doping concentration;
 a semiconductor layer of a second conductivity type adjacent the first region and overlying the semiconductor substrate, the semiconductor layer having a second doping concentration that is less than the first doping concentration and also having a first surface that is opposite to the first region;
 a doped region on the first surface of the semiconductor layer having approximately the first doping concentration; and
 a plurality of semiconductor channels of the second conductivity type extending from the doped region through the semiconductor layer and into the semiconductor substrate, the plurality of semiconductor channels having approximately the first doping concentration.

2. The high capacitance diode of claim 1 wherein the first doping concentration is approximately at least $1\times10^{19}$ atoms/cm$^3$.

3. The high capacitance diode of claim 1 wherein the second doping concentration is at least two orders of magnitude less than the first doping concentration.

4. The high capacitance diode of claim 1 wherein the plurality of semiconductor channels are spaced approximately 0.6 to 2.0 microns apart and have a width of approximately 0.4 to 2.0 microns.

5. The high capacitance diode of claim 1 wherein the doped region has the second conductivity type.

6. The high capacitance diode of claim 1 wherein the doped region has the first conductivity type.

7. The high capacitance diode of claim 1 wherein the first region is a portion of the semiconductor substrate that has the first doping concentration.

8. The high capacitance diode of claim 1 wherein the first region is another semiconductor layer that is formed on the first surface of the semiconductor substrate.

9. The high capacitance diode of claim 1 further including an isolation trench extending from the first surface of the semiconductor layer into the semiconductor substrate, the isolation trench forming a closed polygon on the first surface of the semiconductor layer wherein the closed polygon encloses the doped region.

10. The high capacitance diode of claim 9 further including another high capacitance diode formed on the semiconductor substrate and external to the closed polygon.

* * * * *